United States Patent [19]
Goth et al.

[11] Patent Number: 4,534,826
[45] Date of Patent: Aug. 13, 1985

[54] TRENCH ETCH PROCESS FOR DIELECTRIC ISOLATION

[75] Inventors: George R. Goth; Thomas A. Hansen; Robert T. Villetto, Jr., all of Poughkeepsie, N.Y.

[73] Assignee: IBM Corporation, Hopewell Junction, N.Y.

[21] Appl. No.: 566,593

[22] Filed: Dec. 29, 1983

[51] Int. Cl.³ .................. H01L 21/20; C23C 13/04
[52] U.S. Cl. ............................ 156/643; 156/653; 156/657; 156/661.1; 156/662; 204/192 E; 427/93; 427/255.3
[58] Field of Search ............... 156/625, 643, 644, 646, 156/653, 662, 659.1, 661.1, 657, 668, 904; 29/578, 580; 148/174, 1.5; 204/192 E, 298; 427/39, 93, 86, 255.2, 255.3

[56] References Cited

U.S. PATENT DOCUMENTS

| 3,757,733 | 9/1973 | Reinberg | 148/187 X |
|---|---|---|---|
| 3,919,066 | 11/1975 | Bertens | 204/192 |
| 4,104,086 | 8/1978 | Bondur et al. | 156/649 X |
| 4,110,125 | 8/1978 | Beyer | 156/643 X |
| 4,180,432 | 12/1979 | Clark | 156/643 |
| 4,244,799 | 1/1981 | Fraser et al. | 156/659.1 |
| 4,283,235 | 8/1981 | Raffel et al. | 148/175 |
| 4,314,875 | 2/1982 | Flamm | 156/643 |
| 4,318,751 | 3/1982 | Horng | 156/643 X |
| 4,324,611 | 4/1982 | Vogel et al. | 156/643 |
| 4,330,384 | 5/1982 | Okudaira et al. | 204/192 E |
| 4,333,793 | 6/1982 | Lifshitz et al. | 204/192 E X |
| 4,380,489 | 4/1983 | Beinvogl et al. | 156/643 |

OTHER PUBLICATIONS

Anderson et al., "Etching of SiO Using Plasma", I.B.M. Tech. Discl. Bull., vol. 16, No. 6, Nov. 1973, p. 1892.
Coburn, "Increasing the Selectivity of the Plasma Etch Rate of SiO₂ Relative to Si", I.B.M. Tech. Discl. Bull., vol. 20, No. 2, Jul. 1977, p. 757.
Schaible et al., "Reactive Ion Etching of Silicon", I.B.M. Tech. Discl. Bull., vol. 21, No. 7, Dec. 1978, pp. 2814–2815.
Schaible et al., "Reactive Ion Etching of Silicon", I.B.M. Tech. Discl. Bull., vol. 22, No. 5, Oct. 1979, p. 1819.

Primary Examiner—Edward Kimlin
Assistant Examiner—Ramon R. Hoch
Attorney, Agent, or Firm—John F. Ohlandt

[57] ABSTRACT

A process for etching deep trenches to achieve dielectric isolation for integrated circuit devices; the process insures obtaining substantially perfectly vertical trench walls by precluding significant variation in etch bias during the trench formation.

7 Claims, 23 Drawing Figures

FIG. 1-9
PRIOR KNOWLEDGE
FIG. 1
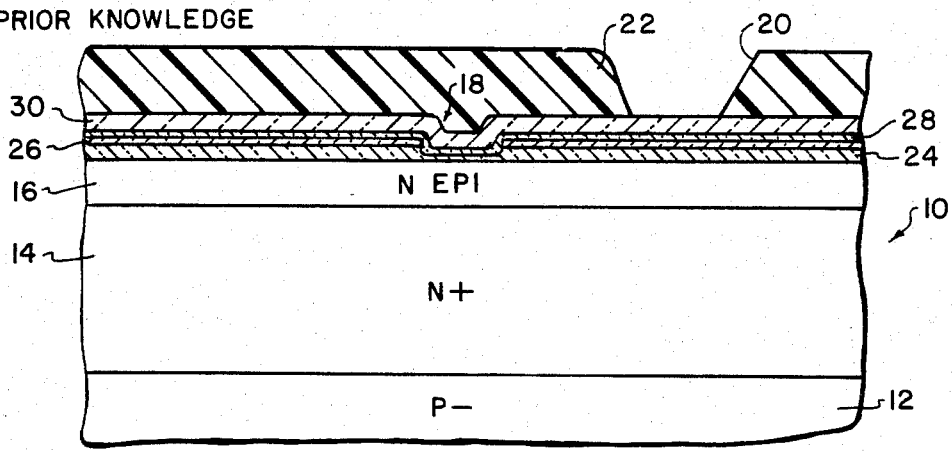
FIG. 2
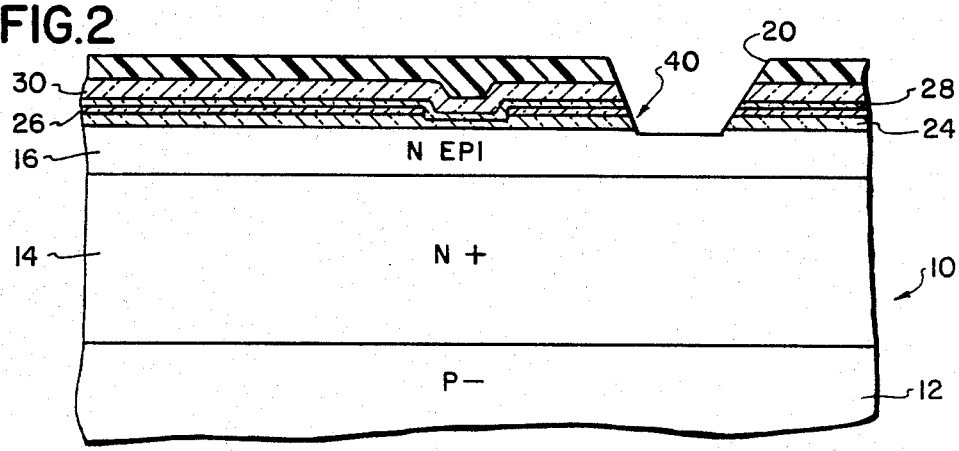
FIG. 3
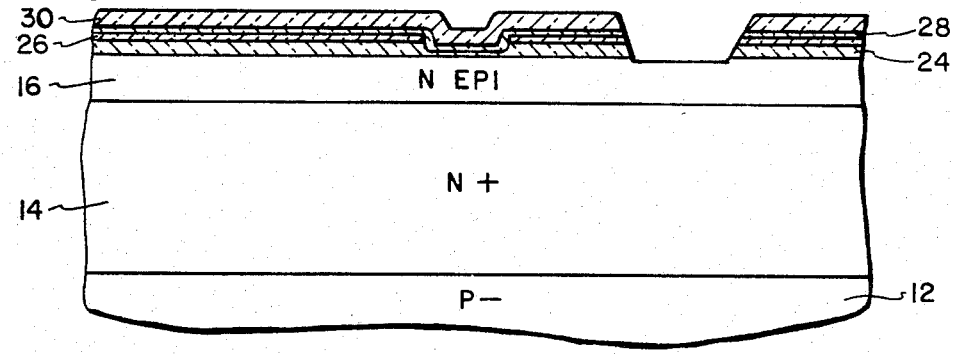

PRIOR KNOW-LEDGE

PRIOR KNOWLEDGE

TRENCH ETCH PROCESS FOR DIELECTRIC ISOLATION

BACKGROUND OF THE INVENTION

1. Field of the Invention

This invention pertains to the field of integrated circuit technology, and more particularly to methods for dielectrically isolating regions of semiconductor bodies in which integrated circuit devices are formed.

2. Background Information

The current state-of-the-art process technology for forming deep trenches to achieve device isolation typically employs a dielectric mask in connection with the step of etching the silicon trenches in which the isolating dielectric material is to be deposited. This is typically accomplished by a reactive ion etch (RIE) technique. For example, the masking dielectric, typically $SiO_2$, is deposited by a chemical vapor deposition process by means of a barrel reactor or low pressure chemical vapor deposition (CVD) furnace system. This trench-defining masking oxide layer is patterned using conventional lithography and is etched anisotropically, preferably using $CF_4$. Following the etching of the masking oxide layer—and, in the usual case, several underlying field dielectric layers composed of $SiO_2$ and $Si_3N_4$—the photoresist overlying the whole structure is stripped and the reactive ion etching of the silicon trenches is executed.

In order to provide further detail of prior art processes which are directed to achieving deep trench etching for isolation purposes, reference may be made to U.S. Pat. No. 4,318,751 and to U.S. Pat. No. 4,104,086, both of which are assigned to the assignee of the present invention.

The first of the above cited patents provides in its introduction an extensive citation of references and a summary of the various approaches that have been taken in the recent past to achieving the desired isolation among devices formed in an integrated monolithic structure. In particular, this patent outlines the problem associated with a previously known dielectric isolation scheme referred to as recessed oxide isolation (ROI), which has the unfortunate result of preventing the device junction sidewalls from fully butting against the dielectric isolation, and thus imposes the need for wider tolerance on device lateral dimensions. That patent also notes that the very recently developed technique of deep dielectric isolation (DDI) avoids such problem, particularly in that the side walls of the DDI structure can be made nearly vertical—at least in principle.

The second patent recited above, that is, U.S. Pat. No. 4,104,086, likewise gives an extensive review of the prior art techniques in isolating devices. It points out that dielectric isolation in trenches, as contrasted with P-N junction isolation and the like, has the substantial advantage that it allows the butting of the circuit elements against the isolation walls and thereby results in greater density of packing of the active and passive devices on the integrated circuit chip.

It will be appreciated that the methods described in U.S. Pat. No. 4,104,086 are directed to providing grooves or trenches of sufficient taper such that the deposited $SiO_2$ will not contain any openings or provide a poor quality dielectric region in the center of the filled groove or trench. Furthermore, that patent provides a method directed to ameliorating the so-called N+ underetching problem. For example, it is often found that the very highly doped silicon of the subcollector layer is etched more isotropically under certain conditions of reactive ion etching than regions of lower doping. Accordingly, U.S. Pat. No. 4,104,086 provides a technique which includes the use of a reactive chlorine specie ambient having defined pressures and etch rates.

Whatever the merits, advantages and features of the aforenoted two patents, there still remain several difficulties or problems associated with the formation of trenches for dielectric isolation. Thus, relatively thick masking oxide layers are required because the conventional etch rate ratios (ERR) of silicon with respect to a silicon oxide mask over the usable operating conditions of the various species of gas used for etching is generally less than 10 to 1. Moreover, image resolution of the desired minimum trench widths ($\leq 2.5$ $\mu m$) becomes difficult when photoresist layers $\geq 1.5$ $\mu m$ are required to mask the reactive ion etching (by $CF_4$) of the combined thickness of the masking layer of $SiO_2$ and the field dielectric layers (approximately 0.8–1.0 $\mu m$).

As a further consequence of the conventional ways of etching the deep trenches, it turns out that the slope of the field dielectric layers at the top of the trenches generally replicates the slope of the photoresist sidewalls (approximately 55°–75°), which results in significant variation in etch bias during the trench etch procedure. Moreover, the variable etch bias negatively impacts parameter control for butted emitters and resistors (width). The aforenoted oxide slope at the top of the trench also results in P to P leakage of butted PNP lateral transistors when slopes $\leq 75°$ are formed.

It should also be noted that the photo limited yield of trench mask levels is typically poor, this being due primarily to particulate contamination in the relatively thick masking $SiO_2$ layer formed by chemical vapor deposition (CVD). For example, this yield is produced because the masking layers are typically about 0.5 to 1.0 $\mu m$ thick.

It must also be pointed out that it has been known in principle to provide preferential or selective etching of the silicon body vis-a-vis the overlying dielectric layers, including a masking layer of $SiO_2$ and the like. Reference may be made, for example, to U.S. Pat. No. 4,330,384; and to articles by Schaible and Schwartz in IBM Technical Disclosure Bulletins Vol. 21, No. 7 of Dec. 1978 and Vol. 22, No. 5 of Oct. 1979. U.S. Pat. No. 4,330,384 describes a plasma etching technique directed to etching a silicon body wherein the etching gas contains at least $SF_6$. However, there is no teaching in this patent with respect to which of the many techniques for providing a dielectric layer of $SiO_2$ is utilized. On the other hand, the disclosures of the two IBM Technical Disclosure Bulletins cited above are special cases which are concerned with the use of chlorine concentrations in the reactive ion etching of silicon, and are directed to obtaining fairly high concentrations of $Cl_2$ of the order of 20% without causing lateral etching in the sub-collector region.

Whatever the features, advantages, and benefits of the various references cited above, none of them enables solving the multiple problems encountered in the technology of trench etching in achieving effective isolation of devices.

Accordingly, it is a primary object of the present invention to enable a reduction in device size of approximately 40% in fabricating a monolithic integrated circuit structure.

It is an ancillary object of the present invention to solve the image resolution problem in connection with deep trench isolation; that is, to enable image resolution of minimum trench widths of the order of 2.5 μm.

A related object is to avoid the undesirable slope normally obtained in the field dielectric layers at the top of the trenches, thereby avoiding significant variations in etch bias or process bias during the trench etching operation.

An additional object is to improve the photo limited yield (PLY) of trench mask levels by avoiding the normally occurring particulate contamination in the relatively thick $SiO_2$ layers.

Another object, in connection with the initial or preparatory etching operations that are conducted prior to actual formation of the trenches, is to provide such a significantly higher etch rate ratio that substantially vertical walls can be realized in the field dielectric and the overlying masking layer of $SiO_2$; that is to say, the trench defining masking layer which overlies the field dielectric layers, the latter remaining as part of the finished structure.

A further object is to obtain an extremely high selectivity in etching at the stage when the trenches are to be formed in the silicon body. It has been known before to employ etching techniques which include $SF_6$ or $Cl_2$. However, these techniques have been used in connection with $SiO_2$ masking layers which have been deposited by chemical vapor deposition, and inherently such layers do not permit the high etch rate ratios desired.

Yet another object is to minimize attack of the field dielectric layers during stripping of the residual mask layer of $SiO_2$, such stripping involving the use of a dilute HF solution.

SUMMARY OF THE INVENTION

In fulfillment of the previously stated objects and purposes of the present invention, there are provided several features in accordance with the concept of the present invention. The key feature resides in what may be characterized as an "image transfer" photo process or technique. Such technique results in the attainment of substantially perfectly vertical sidewalls (that is, 90°±5°) in the deep trenches formed in the semiconductor body for dielectric isolation of devices. This is accomplished by interposing, between the conventionally formed imaging layer of photoresist and the masking layer, two additional layers: one layer being an organic underlay which is applied over the masking layer of $SiO_2$; the other layer being applied over the organic layer and being composed of silicon nitride or oxide.

By means of the image transfer technique to be described, the undesirable slope of the masking layer and field dielectric layers, which normally result from the prior knowledge approach or technique, is obviated. This undesirable slope, which generally replicates the slope of the side walls of the conventional photo resist layer (approximately 55°-75°), causes significant variation in etch bias during the etching step used to form the deep isolation trenches.

It will therefore be appreciated that the technique of the present invention eliminates or lessens such variation in etch bias, thereby insuring that the side walls of the dielectric layers, and hence of the deep isolation trenches, are substantially perfectly vertical. Moreover, other problems due to this undesirable oxide slope, such as poor P to P leakage of butted PNP lateral transistors, or the negative impact on parameter control, are substantially overcome.

A related principal feature of the present invention resides in a trench forming process which includes the replacement of the masking $SiO_2$ layer normally formed by chemical vapor deposition with a plasma deposited $SiO_2$ layer. Such plasma deposition technique is well known in the art. Commercially available equipment, such as the Applied Materials Inc. Plasma I, parallel plate reactor is commonly used. Typical process parameters include deposition temperature of 245° C., deposition pressure of 400 microns, 100 watts of power, in a silane plus nitrous oxide ambient yielding a plasma oxide growth rate of 20 nanometers per minute.

A number of significant advantages attend the use of plasma $SiO_2$ deposited at low temperature. Such use enables substantial reduction in the particulate contamination normally found in the chemically vapor deposited masking $SiO_2$ layer. This is due to the reduced gas phase reaction in a plasma deposition system. As will be apparent to those skilled in the art, use of this type of masking layer substantially reduces photo defect levels which would, under normal circumstances, create non-isolation failures. Also, as previously indicated in the "Objects of the Invention", this plasma deposited $SiO_2$ layer etches three times faster in dilute HF solutions than the higher temperature $SiO_2$ layers formed by chemical vapor deposition. As a result, there is minimization of attack on the field dielectric layers during stripping of the residual masking layer thus formed.

Another ancillary feature of the present invention resides in combining with the steps already described, a reactive ion etching technique for etching the deep isolation trenches, such technique including the use of a combination of $SF_6$ gas and $CL_2$ gas, with the addition of helium, whereby extremely high selectivity is obtained; in other words, a very high etch rate ratio, of the order of 35—1, exists between the rate of etching of the silicon body and the rate of etching of the trench defining plasma deposited layer. Furthermore, there is no undercut of the buried N+ subcollector region or layer. Because of this very high etch rate ratio, much thinner layers for the plasma deposited trench-defining mask are permitted, which aids in reducing the aforenoted particulate contamination.

Viewed as a combination of the several features already described, the present invention can be said to comprise an improved technique for forming deep isolation trenches including the steps of: first, applying an organic underlay, preferably photoresist, over the trench-defining masking layer, followed by plasma deposition of a nitride or oxide layer over the organic underlay; next, applying a conventional imaging layer of photoresist over the plasma deposited layer, and by utilizing conventional photolithographic techniques, creating a pattern of openings in the plasma deposited layer; thirdly, performing reactive ion etching, preferably using $CF_4$, of the plasma deposited layer, followed by a highly selective reactive ion etching of the organic underlay. This is preferably accomplished by the use of $O_2$ as the etchant. The desired vertical walls (greater than 85°) are achieved by virtue of the high etch rate ratio (100 to 1) operative between organic underlayer (e.g. resist) and, for example, the plasma nitride; a reactive ion etching, again by $CF_4$ of the masking $SiO_2$ layer and the field dielectric layers operates to transfer the trench-mask image so as to maintain vertical side walls through the dielectric layers. After stripping of the remaining underlay by means of an $O_2$ ash, the silicon trench is reactive ion etched in an $SF_6$ (2.5%), $Cl_2$ (7.5%), HE (90%) ambient.

Other and further objects, advantages and features of the present invention will be understood by reference to the following specification in conjunction with the annexed drawing, wherein like parts have been given like numbers.

BRIEF DESCRIPTION OF THE DRAWING

FIGS. 1-9 are fragmentary cross sectional views of a semiconductor monolith at various stages in the fabrication process, and illustrating particularly trench isolation, in accordance with the prior knowledge.

DETAILED DESCRIPTION OF A PRIOR KNOWLEDGE PROCESS

Figure 4:
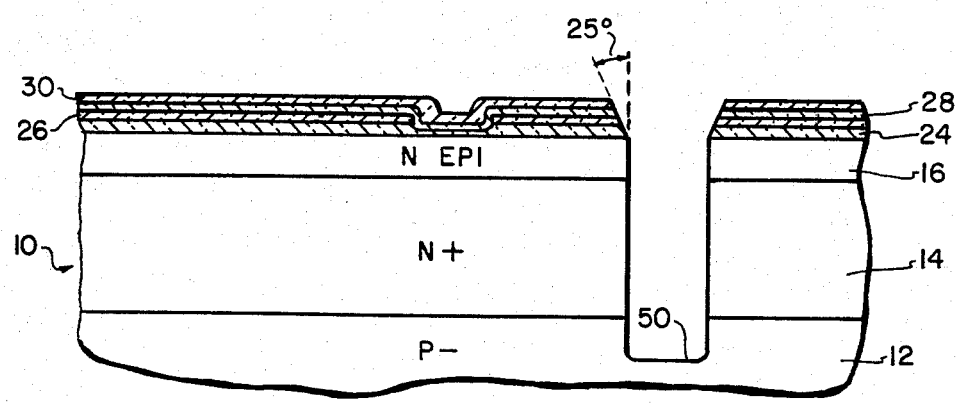

Referring now to FIGS. 1-9, there is illustrated a plurality of steps involved in accordance with an integrated circuit fabrication process well known from a time prior to the filing of the present application. A semiconductor body 10 has formed therein a monolithic structure which is well known. Thus, a P- substrate 12, which constitutes the starting material, has incorporated therein an N+ subcollector 14. A suitably grown N-epitaxial layer 16 has formed within it a typical device structure (not seen) to which contact is to be made at area 18. At this stage of the processing illustrated in FIG. 1, the situation depicted is just after a conventional photolithographic-etching step has been performed to create the opening 20 (of a pattern of appropriate openings) through a photoresist layer 22.

It will be understood that the opening 20 in the photoresist layer 22 is for the purpose of initiating the formation of what will eventually be trenches (i.e. moatlike configurations around islands of individual devices within the monolith). It will be noted that, in conventional fashion, four additional layers which lie above the top surface of the substrate 12 and below the photoresist layer 22 are a genetic oxide layer 24, of $SiO_2$, two successively deposited layers 26 and 28 of silicon nitride for well-known passivation purposes, and a further deposited layer 30 constituted of $SiO_x$. The last-named layer can be selected to be composed of one or more of a variety of oxides. Alternatively, this layer 30 can be also constituted of silicon nitride. It is this masking layer 30 that conventionally serves for trench-defining purposes.

Accordingly, as will be seen by referring to FIG. 2, the opening 20 is further extended through the trench-defining masking layer 30 and also through layers 28, 26, and 24 down to the upper surface of the n-EPI layer 16. This "insulator etch" step is typically accomplished by the use of an etchant such as $CF_4$ in a so-called reactive ion etching technique well known in the art. Such an etchant is chosen because it is selective in etching the photoresist layer 22, the trench-defining masking layer 30 and the other so-called "field dielectric" layers 24, 26, and 28 vis-a-vis the silicon body 10. The field dielectric layers are so called because they remain on the monolithic structure following completion of the fabrication process; whereas the layer 30 is removed once its purpose has been fulfilled, i.e., for the trench etching to be described.

It should be especially noted that the slope of the opening 20 in the photoresist layer 22 is replicated into the underlying insulator layers; see especially FIG. 2, where such slope is denoted by the numeral 40. Thus, there is continued in layers 24, 26, and 28, during the reactive ion etching (RIE) procedure, the profile already developed in the opening 20 created in the photoresist layer. As a result of this slope, there will be substantial variation in the etch bias during etching of the trench 30. In other words, a significant slope will result in the trenches formed, whereby a limit is necesarily imposed on the minimum size of devices that can be fabricated in order to take into account, hence allow space for, such slope. As seen in FIG. 4, there is a substantial deviation from verticality as indicated at the top of the trench wall by the dotted line 41 which is at an angle of 25° or greater from the vertical.

In FIG. 3, there will be seen the stage at which the photoresist layer 22 has been stripped from the monolith or body 10. This is typically accomplished by a buffer HF solution.

FIG. 4 illustrates the actual formation of trenches for purposes of device isolation, a portion of the trench 50 being seen in that figure. A highly selective etchant, for example, $SF_6$ could be chosen for forming such trenches. In this connection, see U.S. Pat. No. 4,330,384, previously cited, in which the etch rate ratio between silicon and silicon oxide, when $SF_6$ is selected, is indicated as being of the order of 15. Such an etchant is highly selective in etching the silicon body 10 when compared with the etching of the insulative layers, that is, the masking layer 30, the oxide protective layer 24 and nitride passivating layers 26 and 28. After the trench etching step, the masking oxide layer 30 is stripped (see FIG. 5) by use of a buffer HF solution. As a consequence, it will be seen in this figure that the $Si_3N_4$ layers 26 and 28 and the genetic oxide layer 24 are pulled back from the trench edge. This is an extremely undesirable result because the trench edge becomes exposed. Therefore, a block-out mask must be used at a later stage, as will be made apparent.

Figure 6:
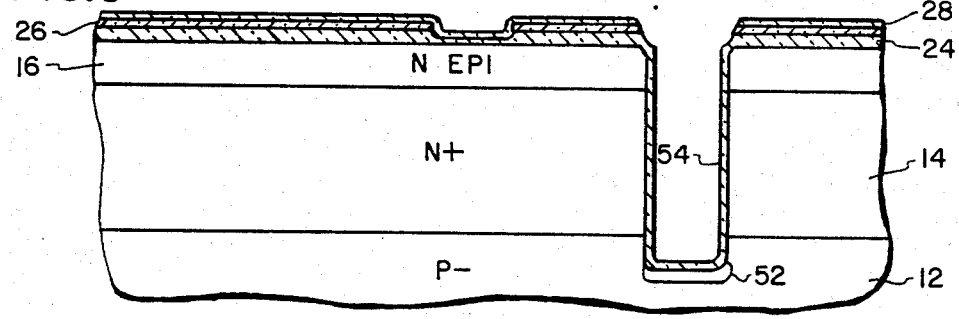

In FIG. 6 there will be seen the result of the creation of a so-called "channel stop" 52 by implantation of a suitable P-type impurity at the bottom of the trench 50. Also, the bottom and side walls of the trench 50 have been oxidized to create a protective layer 54.

Figure 7:
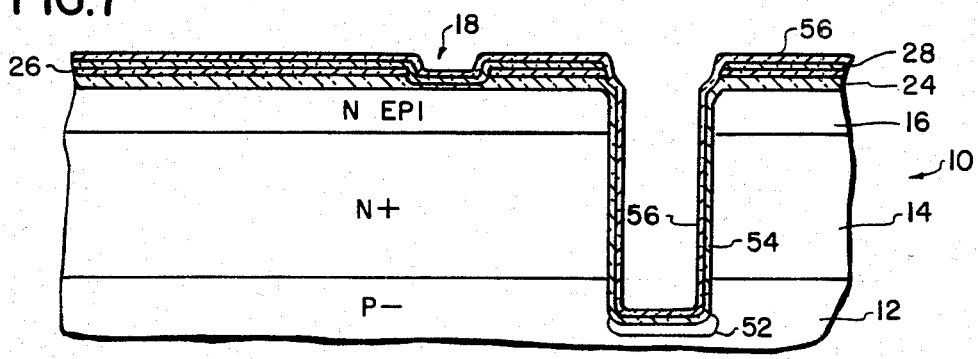

As seen in FIG. 7 an additional nitride layer 56 is formed over the entire upper surface, including down into the trench 50. This is sometimes referred to as a silicon nitride "overcoat".

Figure 8:
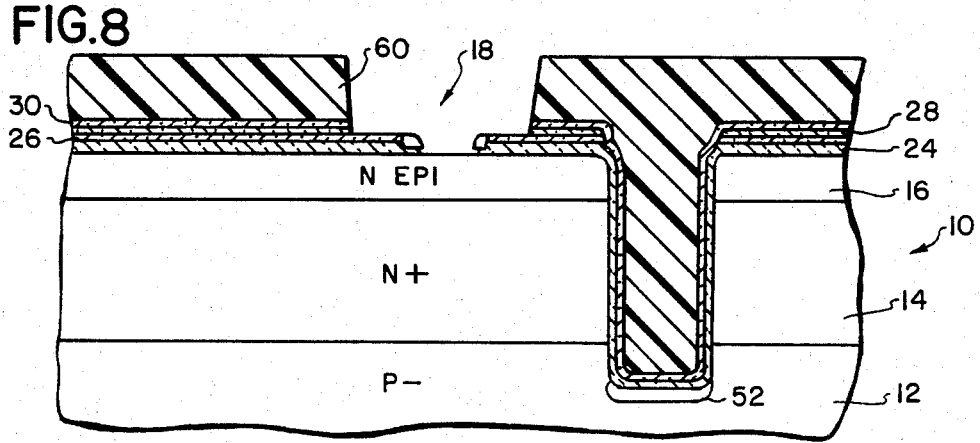
Figure 9:
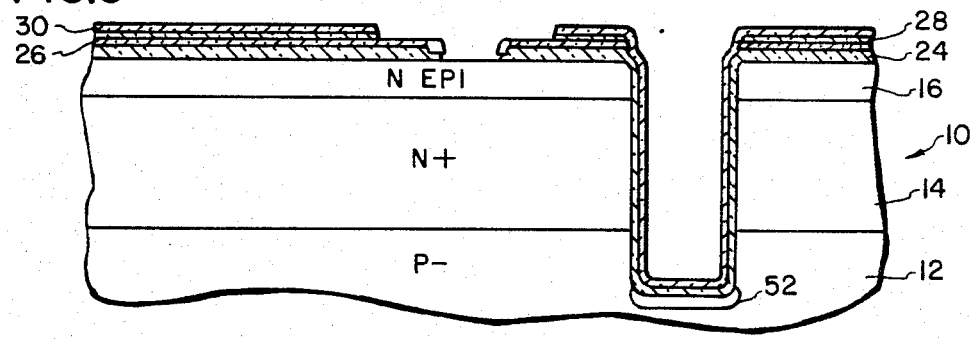

In FIG. 8, there will be seen the formation of a contact block-out mask 60 of photoresist material. This mask is required to protect the trench edge after the previous step of forming the silicon nitride layer 56. It will be appreciated that by the use of this mask 60, the layers 24, 26, 28 and 56 are selectively opened in the area 18 for device contact purposes. The mask 60 is then stripped by means of a hot sulfuric acid solution to provide the resultant configuration seen in FIG. 9.

DESCRIPTION OF PREFERRED EMBODIMENT

Figure 10:
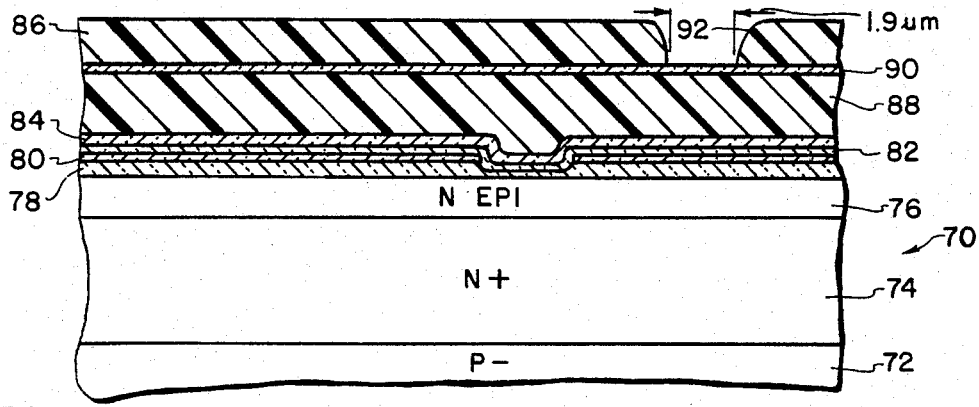
FIGS. 10-19 are fragmentary cross sectional views of a semiconductor monolith taken at the several stages in accordance with the process of the present invention.

Having described in significant detail the accepted or conventional practices in the fabrication of integrated circuit devices, involving the formation of deep trenches for isolation, attention is now turned to the principal features and advantages of, as well as the distinct results achieved by, the process of the present invention. A fundamental result which must be emphasized is that a reduction in integrated circuit device size of approximately 40% is achievable by the present invention. Such reduction is chiefly attributable to the improvement in technique of fabricating the trenches for isolation purposes and this improvement flows from a fundamental feature based on "starting off on the right foot", so to speak. Accordingly, instead of the insulator etch step previously described in connection with FIG. 2, which follows the step of creating the opening or openings in the topmost photoresist layer which has been photolithographically exposed and developed in conventional fashion, the technique of the present invention begins as seen in FIG. 10. Here the trench-defining mask is formed in a totally different manner.

It will be seen in FIG. 10 that a substrate or monolith 70 is provided which is identical to the monolith 10 of FIG. 1, and includes the original substrate 72, an N+ subcollector region 74, an N-epi device layer 76 and, like the prior art, a succession of layers formed on the substrate starting with the genetic oxide layer 78, then passivation layers 80 and 82 of silicon nitride, and a trench-defining layer of $SiO_x$ designated 84. This last-named layer is formed in accordance with an ancillary feature of the present invention which is based on a low temperature, plasma deposition technique. This permits formation of the trench-defining masking layer 84 to be of a lesser thickness than was the case with the trench-defining masking layer 30 of FIG. 1, precisely because the etch rate ratio that is operative with the plasma deposited layer 84 vis-a-vis the silicon body is much higher (approximately 1 to 35). Another advantage of the thinner masking layer 84 is that such plasma deposited silicon oxide etches approximately three times faster in dilute or buffer HF solutions than chemically vapor-deposited $SiO_2$ layers (which are conventional). Therefore, there is a lessened attack of the underlying field dielectric layers, that is, layers 78, 80, and 82 during stripping of the residual masking layer. Yet another advantage of the thinner masking layer 84, which is of the order of 0.4 micrometers, is that particulate contamination, which produces poor photo limited yield, is less.

An uppermost photoresist layer 86 is provided and this is similar to the photoresist layer 22 of FIG. 1. However, in the context of the present invention, improved image resolution of minimum trench widths is much improved because the photoresist layer 86 can be much thinner than layer 22, as will be made apparent.

The primary feature already referred to resides in the fact, as will be seen in FIG. 10, that two layers are interposed between the masking layer 84 and the photoresist layer 86: an organic "underlay" or layer 88, which can be composed of photoresist or polyimide, the former being preferred in most cases; and another interposed layer 90, for example of $SiO_x$, which is selected to be quite thin as will be seen.

In the process of the present invention, the initial step in creating the trenches is to develop the pattern of openings 92 in the photoresist layer 86. Following this, the layer 90, hereinafter referred to as a barrier layer, is etched through by means of the use of $CF_4$ in a reactive ion etching operation. Precisely because this barrier layer 90 has been provided to be quite thin, of the order of 0.2 micrometers, the photoresist layer 86 need only be a relatively thin layer, of the order of 0.5 to 1.0 micrometers.

Figure 11:
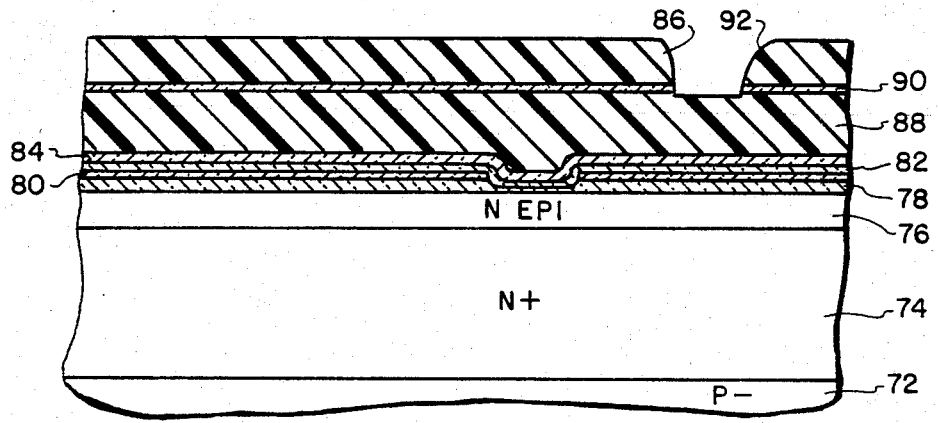
Figure 12:
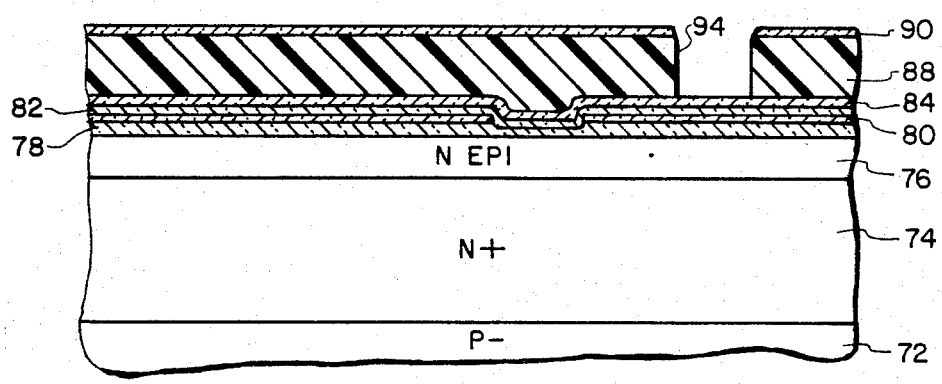

It should be noted that precisely because of the thinness of the layer 90, any slight slope produced in extending the opening 92 into such barrier layer 90 (see FIG. 11) will have minimal effect.

The real step of "getting off on the right foot" comprises the etching through the organic underlay or layer 88. It is to be especially noted that unlike the prior art, a substantially perfectly vertical slope 94 is achieved in this organic underlay. The reason for this is that a very highly selective etchant is employed for the purpose, such etchant preferably being oxygen. The etch rate ratio is greater than 100 to 1 for the $O_2$ reactive ion etch of this underlay organic material vis-a-vis the overlying plasma-formed oxide or nitride layer 90.

Figure 13:
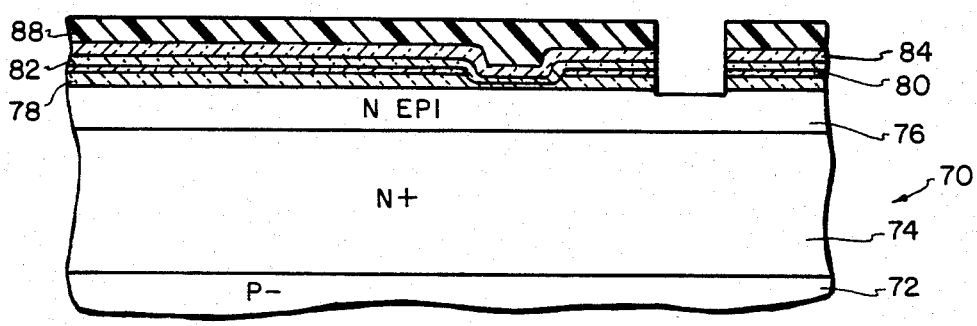

Having realized the desired slope for the organic underlay, the insulator layers (that is, layers 84, 82, 80, and 78) are to be etched by means of $CF_4$ reactive ion etching. Consequently, the desirably formed trench walls are continued into the insulative or insulator materials reaching down to the semiconductor substrate surface (see FIG. 13).

Figure 14:
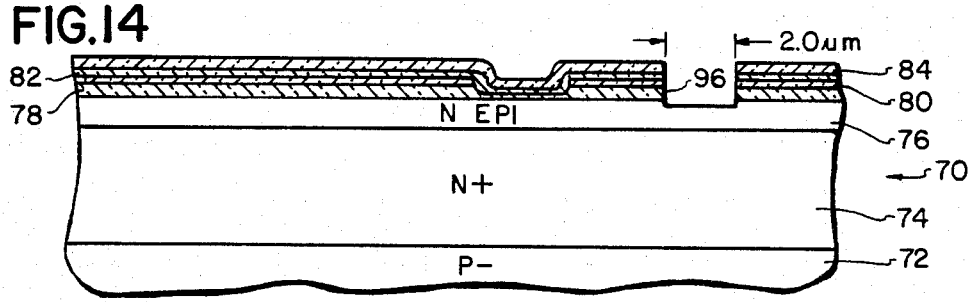

Next, the organic underlay is stripped and the result is as seen in FIG. 14 with the desired vertical insulator edge 96 as a direct continuation or extension of the vertical edge of the underlay 88.

Figure 15:
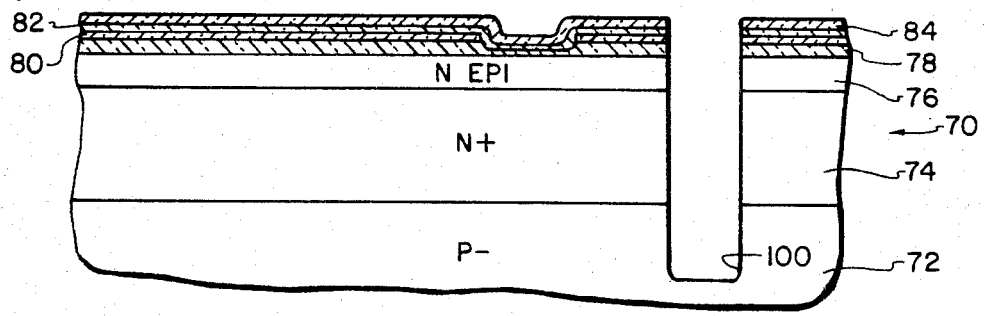

Referring now to FIG. 15, there will be seen in that cross-sectional view the result of the step of etching the deep isolation trench 100. This is accomplished using an etchant gas comprising $SF_6$ plus $CL_2$ in a reactive ion etching (RIE) technique. What has been discovered in connection with this etching step is that the particular etchant selected, in combination with the fact that the masking layer 84 is constituted of plasma deposited $SiO_x$, enables highly selective etching to take place. Thus it has been found that an etch rate ratio as high as 35 to 1 (silicon body to plasma-deposited $SiO_x$ layer) is operative. Accordingly, substantially perfectly vertical trench walls are realized.

Figure 5:
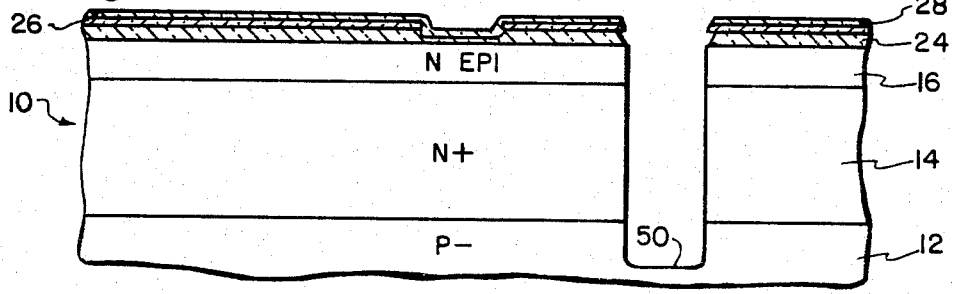
Figure 16:
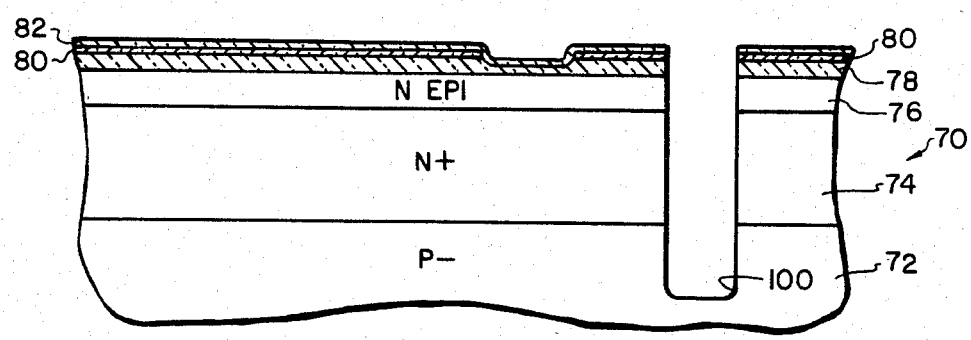
Figure 17:
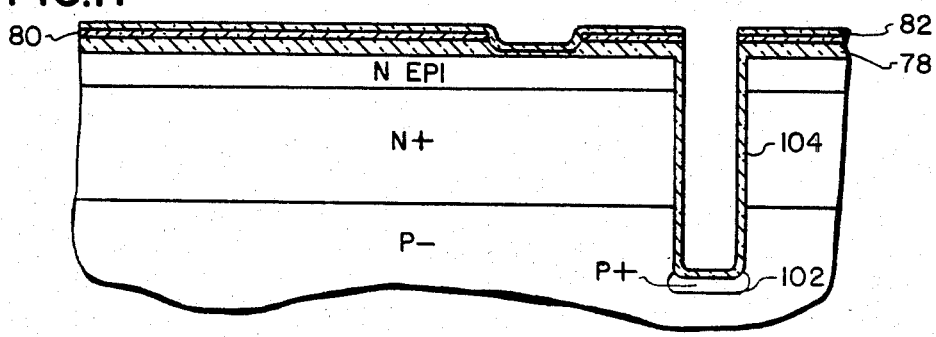
Figure 18:
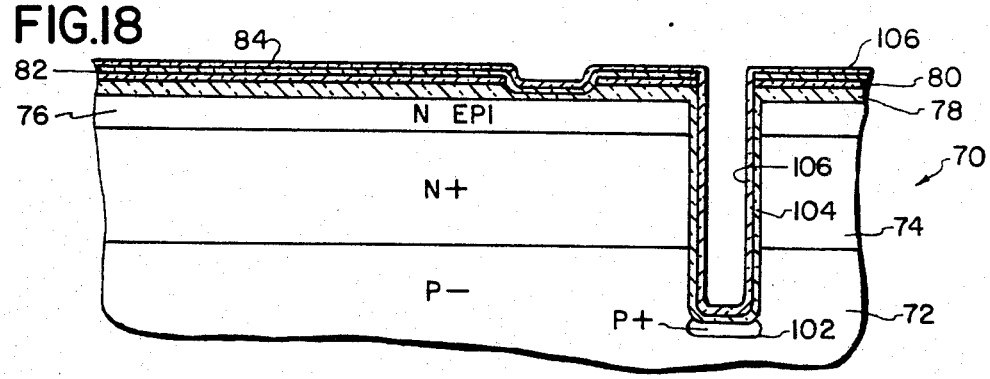

As will be apparent to those skilled in the art, the steps illustrated in FIGS. 16, 17, and 18 are substantially repeats of the prior art steps illustrated in FIGS. 5, 6, and 7 respectively. In FIG. 16, it will be seen that the masking layer 84 has been stripped from the monolith, leaving only the field dielectric layers 78, 80, and 82. In FIG. 17 there will be seen the formation of the implanted channel stop 102, as well as the oxide layer 104, formed within the trenches. FIG. 18 shows the further deposition of a silicon nitride overcoat or layer 106.

Figure 19:
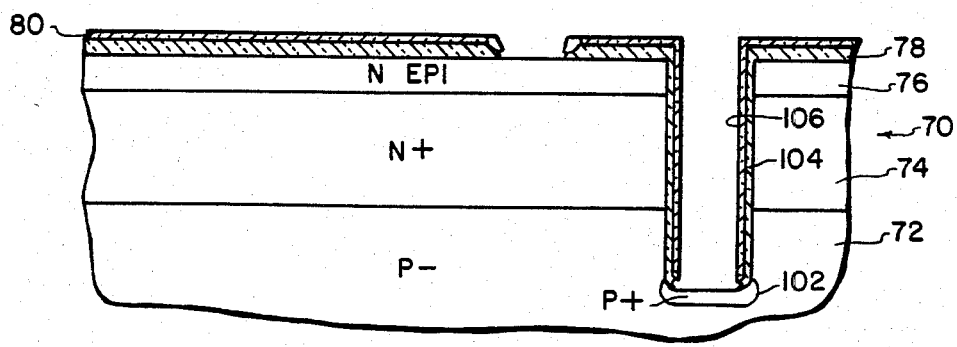

In FIG. 19, the so-called "all contact" etch is performed with the result that the appropriate openings 108 are formed through the field dielectric layers 78, 80, and 82 down tp the substrate. It should be noted, in this connection, that it is not necessary as was the case with the example from the prior art, to form a separate contact "block-out" mask (see FIG. 8) in order to protect the trench edges.

Figure 22:
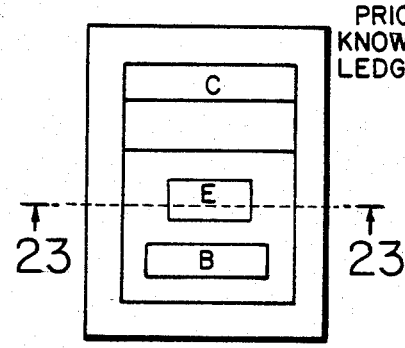
FIG. 22 is a plan view of a similar trench-isolated device of the prior knowledge.
Figure 21:
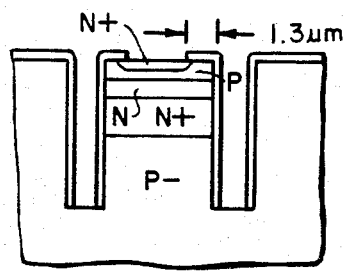
FIG. 21 is a transverse cross sectional view taken on the line 21—21 of FIG. 20.
Figure 23:
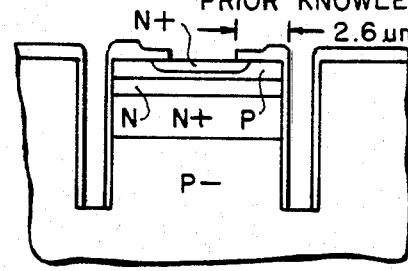
FIG. 23 is a transverse cross sectional view taken on the line 23—23 of FIG. 22.

Referring now to FIGS. 20, 21, 22, and 23, it will be seen that the first two figures are a plan and transverse cross-sectional view respectively of a typical device produced by the process of the present invention; whereas, in like views in FIGS. 22 and 23, there is shown a typical device resulting from the process of the prior art. This comparison is for a typical NPN transistor, and the result is a reduction in device size of approximately 40% by use of the present invention, as will now be made clear.

Figure 20:
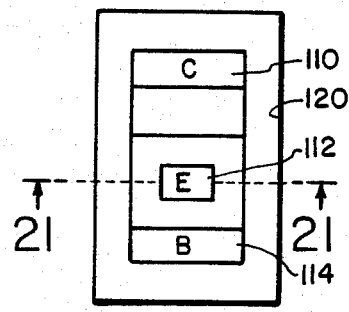
FIG. 20 is a plan view illustrating a typical device in the monolith isolated by trench isolation performed in accordance with the present invention.

In FIG. 20, it will be appreciated that the collector, emitter and base contact windows 110, 112, and 114 are formed through the field dielectric layers 78 and 80 (seen in previous figures). The isolation trench (which is filled in a subsequent step not illustrated) is designated 120. Because of the substantially perfectly vertical slope of the field dielectric layers, the typical transistor can be formed in extremely small dimensions. What accounts for this size reduction is the ability, due to the vertical slope attainable by the present invention, to "butt" the base contact on its three sides, right up against the trench perimeter. This "butting" of the contact 114, as seen in FIG. 20, can be done without fear of shorting the base-collector junction from metallization reaching down to the N-epi layer, which would be a consequence of inadvertently etching away the conventionally sloping dielectric layers at the top edges of the isolation trenches.

As a result of the technique of the present invention, the space normally required, as seen in FIG. 23, between the base contact and the trench perimeter, can be saved, thereby permitting greater packing density for devices within a semiconductor monolith. As will be seen in FIG. 21, the resultant width of the field dielectric layers overlying the base-emitter junction, is of the order of 1.3 micrometers. This cross sectional view is through the emitter region, that is, on the line 21—21 of FIG. 20. In contrast therewith, the similar transistor device of the prior art, depicted in FIGS. 22 and 23, would, as seen in FIG. 23, have a comparable dimension of 2.6 micrometers for the width of the field dielectric layers.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

We claim:

1. In a process of forming integrated circuit devices in a semiconductor substrate, according to which isolation trenches are produced by selectively etching through at least one trench-defining masking layer and at least one passivating layer disposed above the substrate, in order to reach down to the upper surface of said substrate, subsequent to an initial step of forming a pattern of openings through a conventional uppermost photoresist layer disposed above said trench-defining mask layer, the improvement comprising the steps of:

first, plasma-depositing $SiO_2$ to define the trench-defining masking layer;

interposing between said trench-defining masking layer and said uppermost photoresist layer, a first organic underlayer and a second, barrier layer above said organic underlayer;

then, creating the conventional pattern of openings through the uppermost photoresist layer, followed by selectively etching corresponding openings in said barrier layer;

followed by the further step of selectively etching the organic underlayer, by using a highly selective etchant, whereby substantially perfectly vertical walls are produced in the corresponding pattern of openings in the organic underlayer;

extending said openings by anisotropically etching through said trench-defining masking layer and said passivating layer down to said substrate whereby substantially perfectly vertical walls are produced in the corresponding pattern of openings in the masking layer and passivating layer;

removing said organic underlayer;

forming the isolation trenches within the semiconductor substrate by using an anisotropic highly selective etchant to etch into said substrate whereby substantially perfectly vertical walls are produced in the trenches, said highly selective etchant being a gas comprising $SF_6$, $CL_2$ and an inert gas, removing said trench-defining masking layer by the use of an HF solution such that the high etch ratio, which obtains between the plasma-deposited trench-defining masking layer of $SiO_2$ and the passiating layer of $SiO_2$ when such HF solution is used, precludes significant etching of said passivating layer, and opening device contact holes in said passivating layer without the use of masking to protect said walls of said trenches.

2. The improvement as defined in claim 1, in which the selective etching of the corresponding openings in the barrier layer is by reactive ion etching.

3. The improvement as defined in claim 2, in which the selective etchant used is $CF_4$.

4. The improvement as defined in claim 1, in which the highly selective etchant for etching the organic underlayer, while insubstantially etching the barrier layer, is $O_2$.

5. The improvement as defined in claim 1, in which the etchant used for etching through the trench-defining masking layer and the passivating layer down to said substrate, is $CF_4$.

6. The improvement as defined in claim 1, in which the organic underlayer is constituted of photoresist material.

7. The improvement as defined in claim 1, in which the thickness of the uppermost layer of photoresist material is approximately 1.0 micrometers, the thickness of the barrier layer is approximately 0.2 micrometers, the thickness of the organic underlayer is approximately 1.6 micrometers, and the thickness of the trench-defining masking layer is approximately 0.4 micrometers.

* * * * *

UNITED STATES PATENT AND TRADEMARK OFFICE
CERTIFICATE OF CORRECTION

PATENT NO. : 4,534,826

DATED : August 13, 1985

INVENTOR(S) : George R. Goth; Thomas A. Hansen
and Robert T. Villetto, Jr.

It is certified that error appears in the above-identified patent and that said Letters Patent are hereby corrected as shown below:

Column 9, line 55, "mask" should read --masking--;

Column 10, lines 30 and 31, should read --passivating-- rather than "passiating".

Signed and Sealed this

Twenty-sixth Day of November 1985

[SEAL]

Attest:

Attesting Officer

DONALD J. QUIGG

Commissioner of Patents and Trademarks